United States Patent [19]

Abraham et al.

[11] 4,264,914
[45] Apr. 28, 1981

[54] WIDE-BAND-GAP, ALKALINE-EARTH-OXIDE SEMICONDUCTOR AND DEVICES UTILIZING SAME

[75] Inventors: Marvin M. Abraham; Yok Chen; Robert H. Kernohan, all of Oak Ridge, Tenn.

[73] Assignee: The United States of America as represented by the United States Department of Energy, Washington, D.C.

[21] Appl. No.: 973,660

[22] Filed: Dec. 27, 1978

[51] Int. Cl.$^3$ ............................................. H01L 29/227
[52] U.S. Cl. ........................................ 357/10; 357/61; 357/63; 252/62.3 ZT; 307/200 R
[58] Field of Search ............... 307/200 R; 357/10, 61, 357/63; 252/62.3 ZT, 62.3 V, 62.3 ZB, 62.3 T

[56] References Cited

U.S. PATENT DOCUMENTS

| | | | |
|---|---|---|---|
| 3,121,035 | 2/1964 | Heinze | 357/10 |
| 3,142,594 | 7/1964 | Bahe | 357/10 |
| 3,429,831 | 2/1969 | Garfinkel et al. | 357/10 |
| 3,549,561 | 12/1970 | Westerveld et al. | 357/10 |
| 3,630,743 | 12/1971 | Harvill | 357/10 |

OTHER PUBLICATIONS

Abraham et al., Journal of Chemical Physics, vol. 55, No. 8, Oct. 15, 1971, pp. 3752–3756.
Yau et al., Solid State Electronics, vol. 17, (1974), pp. 193–201.
Abraham et al., Physical Review Letters, vol. 37, No. 13, Sep. 27, 1976, pp. 849–852.
Chen et al., Physical Review B, vol. 16, No. 12, Dec. 15, 1977, pp. 5535–5542.

*Primary Examiner*—William D. Larkins
*Attorney, Agent, or Firm*—Fred O. Lewis; Stephen D. Hamel; James E. Denny

[57] ABSTRACT

This invention relates to novel and comparatively inexpensive semiconductor devices utilizing semiconducting alkaline-earth-oxide crystals doped with alkali metal. The semiconducting crystals are produced by a simple and relatively inexpensive process. As a specific example, a high-purity lithium-doped MgO crystal is grown by conventional techniques. The crystal then is heated in an oxygen-containing atmosphere to form many [Li]$^\circ$ defects therein, and the resulting defect-rich hot crystal is promptly quenched to render the defects stable at room temperature and temperatures well above the same. Quenching can be effected conveniently by contacting the hot crystal with room-temperature air.

10 Claims, 8 Drawing Figures

WIDE-BAND-GAP, ALKALINE-EARTH-OXIDE SEMICONDUCTOR AND DEVICES UTILIZING SAME

BACKGROUND OF THE INVENTION

This invention was made in the course of, or under, a contract with the U.S. Department of Energy.

The invention relates generally to semiconductors and to semiconductive devices utilizing the same. More particularly, it relates to novel semiconducting alkali-metal-doped alkaline-earth-oxide crystals which are characterized by a relatively high conductivity at temperatures up to and well above room temperature.

It is known in the art that Li-doped crystals of MgO can be exposed to high-dose electron radiation for long periods, as for six hours, to form so-called [Li]° defects (trapped-hole centers) therein. Each such defect includes a substitutional positive ion of lithium, the ion having a bound hole at a neighboring oxygen site. The number of [Li]° defects produced by such irradiation is relatively small, and the typical defect is stable at temperatures up to only approximately 400 K.; above this temperature the defects begin to anneal out. Producing such defects by high-dose electron irradiation is expensive, time-consuming, and not closely controllable from run to run. Another known technique for producing Li-doped MgO crystals containing [Li]° defects comprises exposing them to low-dose ionizing radiation at low temperatures (e.g., 77 K.), but the resulting [Li]° defects are not stable at room temperature. Prior to the work described herein, lithium-doped MgO crystals have been considered to be electrical insulators.

Li-doped crystals of CaO and SrO have also been exposed to low-dose ionizing radiation at 77 K., producing [Li]° defects. Just as in MgO, these [Li]° defects are unstable at room temperature and such crystals were considered to be electrical insulators.

OBJECTS OF THE INVENTION

Accordingly, it is an object of this invention to provide improved semiconductor devices.

It is another object to provide semiconductor devices including a semiconductor alkali-metal-doped alkaline-earth-oxide crystal having relatively high conductivity at temperatures well above room temperature.

It is another object to provide relatively inexpensive semiconductor devices of the kind just described.

Other objects will become evident hereinafter.

SUMMARY OF THE INVENTION

A semiconductor device comprising (1) a p-type semiconducting body of lithium-doped crystalline alkaline-earth oxide, said body having been heated in an oxygen-containing atmosphere to form [alkali]° defects therein and then promptly quenched to render said defects stable at room temperature and (2) an electrode in contact with a surface of the quenched body.

DESCRIPTION OF THE PREFERRED EMBODIMENTS

This invention was made in the course of an investigation to determine why the presence of lithium in MgO insulators suppresses radiation damage in the insulators. For the purposes of that investigation, Li-containing MgO crystals were subjected to a treatment involving heating and then quenching. Later, we discovered that the treatment had made the crystals semiconducting.

Our novel semiconducting component is produced by means of a special technique which we have developed. Conventional starting materials and conventional equipment may be used. Briefly, the starting material may be a selected transparent or translucent alkaline-earth-oxide crystalline body doped with a selected alkali metal. The crystal is maintained at a selected elevated temperature in an oxygen-containing atmosphere for a time sufficient to form [alkali]° defects (trapped-hole centers) therein, each such defect including a substitutional positive ion of the dopant, the ion having a bound hole at a neighboring oxygen site. The formation of these defects is accompanied by the emergence and growth of a bluish coloration of the crystal, which coloration corresponds to an optical absorption band at approximately 1.8 eV and thus an increasing absorption coefficient $\alpha$.

When the heat treatment in the oxygen-containing atmosphere is terminated, the hot crystal is prompltly quenched in any suitable medium, thus "freezing-in" the defects and rendering them stable at temperatures well above room temperature. The resulting quenched crystal is a semiconductor having p-type characteristics. As will be discussed, the value of the aforementioned absorption coefficient $\alpha$ is essentially proportional to the total number of [alkali]° defects formed and thus dependent on the crystal-treatment temperature. The total number of such defects formed (a) is zero until a threshold temperature is reached; (b) increases nearly linearly with temperature over an extended range; and (c) reaches a maximum at a temperature much above the threshold. Thus, other things being constant, the treatment temperature can be varied to provide the product crystal with any one of a range of [Li]° concentrations and therefore conductivities.

Describing the production of our semiconductor in more detail, single crystals of MgO doped with lithium were prepared in conventional fashion by arc-fusion of a powder mixture of high-purity MgO (Kanto Chemical Company, Tokyo) and 5% by weight of reagent-grade $Li_2CO_3$. The arc-fusion was conducted in the manner described in the following publications: Abraham, Butler, and Chen, *The Journal of Chemical Physics*, Vol. 55, No. 8, Oct. 15, 1971, and U.S. Pat. No. 3,829,391, issued on Aug. 13, 1974. The actual concentration of lithium in wafers sliced from the resulting ingot was approximately 0.03 to 0.05 atomic percent. These wafers, or single crystals, had a thickness of approximately 1 mm and an area of approximately 200 mm². They were highly pure and virtually transparent. The crystals were heated for various times and in various atmospheres in a conventional electric furnace (Model 7AV, Sentry Company, Foxboro, Mass. The furnace included a quartz tube (diameter, 3.5 cm) which extended through the furnace, along the horizontal axis thereof. The crystal was positioned in the tube at a point approximating the midpoint of the furnace. Conventional means were provided for maintaining a selected atmosphere in the quartz tube throughout the furnacing operation. The resulting hot crystal was quenched promptly (usually by exposure to room-temperature air) in order to effect "freezing-in" of the [Li]° defects formed during the heat treatment, thus rendering the defect stable at temperatures well above room temperature. Following quenching, optical-absorption measurements were conducted at room temperature by conventional techniques, using a Cary Model 14R spectrophotometer. The electrical conductivities of the quenched crystals were measured by a conventional technique described in the 1976 *Book of ASTM Standards*, Part 38, D-275-76, pp. 86–106.

EXAMPLE 1

Crystal Heated in Static Air before Quenching

An alumina dish containing a wafer sliced from the above-mentioned ingot was positioned in the quartz tube of the above-mentioned electric furnace, the furnace having been pre-heated to a selected treatment temperature. The crystal was furnaced for ten minutes to ensure that its temperature approximated that of the furnace, after which the hot crystal was promptly quenched in room-temperature air to "freeze-in" [Li]° defects formed in the furnacing operation. Quenching was effected by rapidly transferring the crystal to an end section of the above-mentioned quartz tube, the end section being open to air and at room temperature. For experimental purposes, the furnacing/quenching cycle was repeated several times, each time at a higher furnace temperature. The lowest-temperature furnacing operation was conducted at 615 K.; the highest, at 1582 K. Optical-absorption spectrum measurements were conducted with the crystal in the as-grown condition (i.e., before furnacing) and after each of the cycles. Such measurements showed that the threshold temperature for the generation of [Li]° defects was approximately 1300 K.

Figure 1:
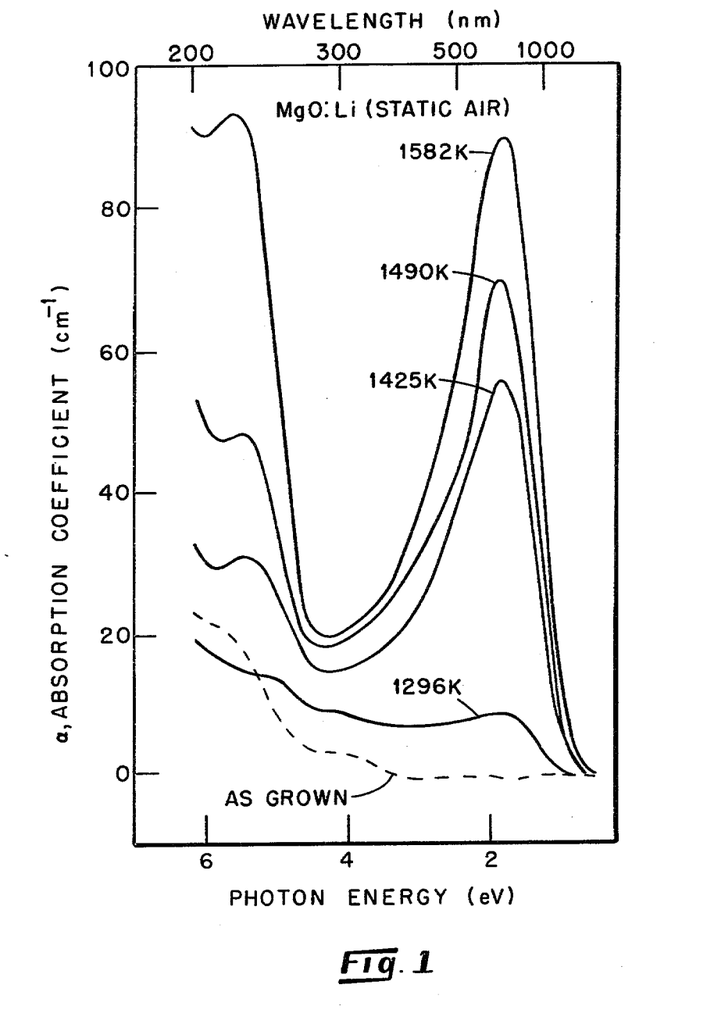
FIG. 1 is a graph showing optical absorption spectra for a Li-doped MgO crystal (1) in the as-grown state and (2) after each of a succession of special heating-/quenching cycles in static air.
Figure 2:
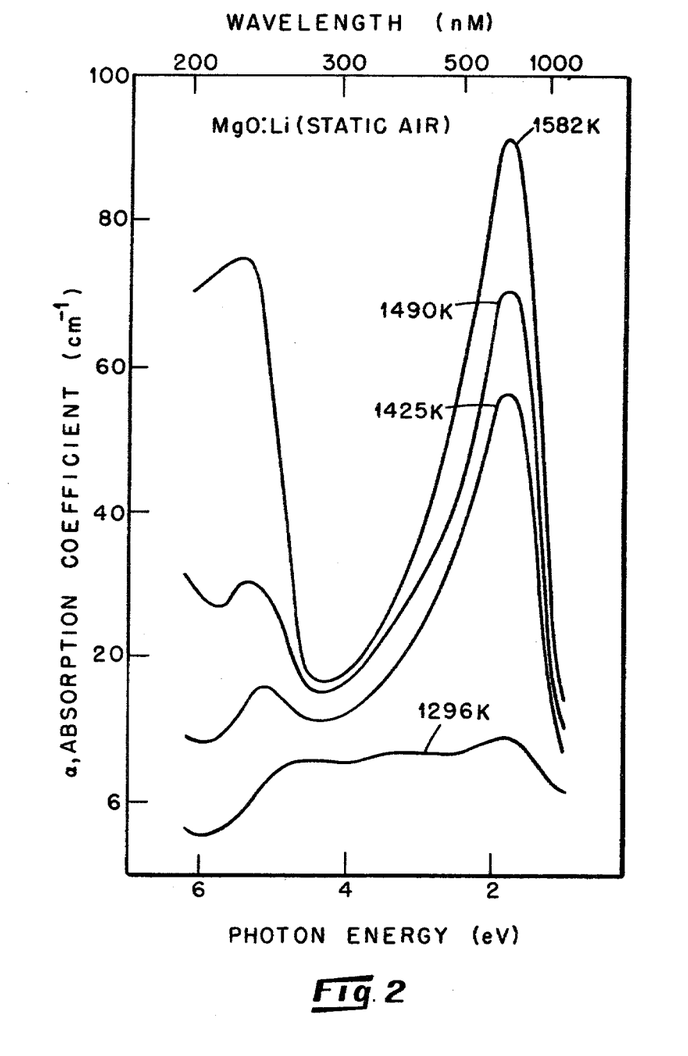
FIG. 2 is a graph showing differential optical absorption spectra for the crystal after each of said cycles in static air.

FIG. 1 presents the optical-absorption spectra obtained for the crystals as quenched at 1296 K., 1490 K., and 1582 K. FIG. 2 presents the corresponding differential spectra; these were obtained by subtracting the "as-grown" curve from the other curves shown in FIG. 1. As indicated in these figures, an optical-absorption of 1.8 eV was generated when the furnace temperature was increased to approximately 1296 K. This absorption band, which is due to the presence of [Li]° defects, was not generated in the lower-temperature runs. As shown, the 1.8 eV band increased in intensity as the furnace temperature was increased stepwise from 1296 K.; in other words, over an extended range the absorption coefficient $\alpha$ increased with the temperature at which the crystal was furnaced and quenched. The emergence of the 1.8 eV band causes a color change in the crystal. That is, when heated to 1296 K. in static air, the initially clear crystal developed a bluish cast which darkened with the succeeding treatments at higher temperatures. As indicated in FIGS. 1 and 2, the quenched-crystal spectra also exhibited a prominent absorption band at 5.3 eV.

Figure 3:
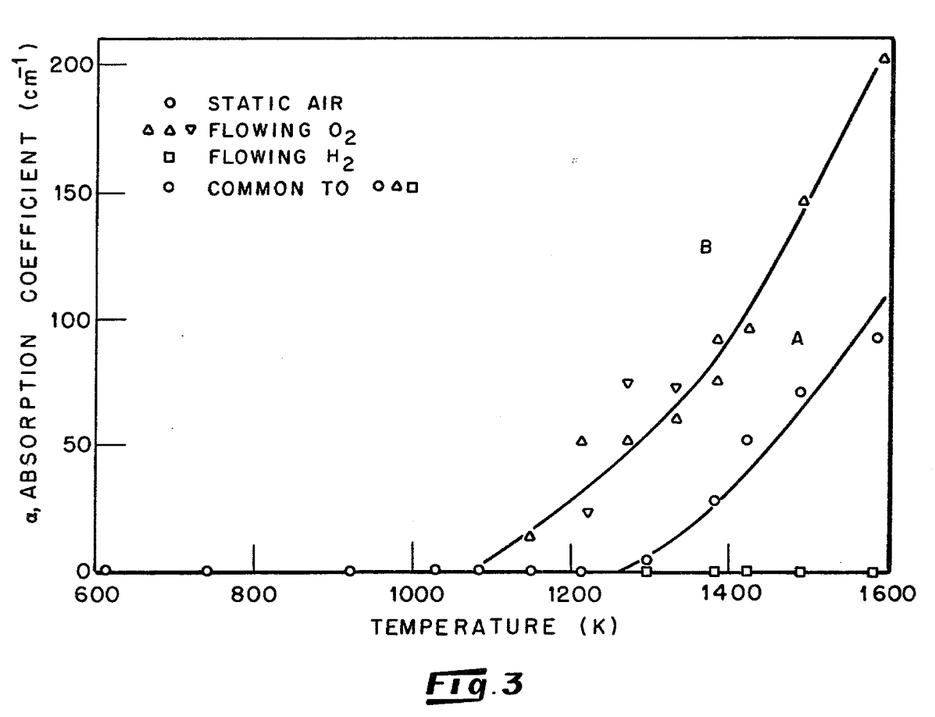
FIG. 3 is a graph correlating temperature (K.) and optical absorption coefficient for three sets of identical crystals treated by a succession of such cycles, two of the crystals being heated in oxygen-containing atmospheres and one being heated in hydrogen.

Referring to FIG. 3, curve A correlates the absorption coefficient $\alpha$ and the crystal-furnacing temperature for the above-described runs conducted in static air. As previously mentioned, the threshold temperature approximated 1300 K.; the linear portion of the curve extended up to 1600 K. The current-versus-voltage curve (FIG. 4) was determined for this crystal after it had been maintained at about 1500 K. for about 10 minutes and then quenched promptly as described. The curve was determined by the above-referenced ASTM technique, the d.c. applied voltage being increased from zero to 250 volts, then decreased to 250 volts, then increased to zero. The resulting curve comprised two superimposable segments extending respectively above and below the voltage axis. At 250 volts, the current flow through the semiconducting crystal was $61 \times 10^{-8}$ amps.

Figure 5:
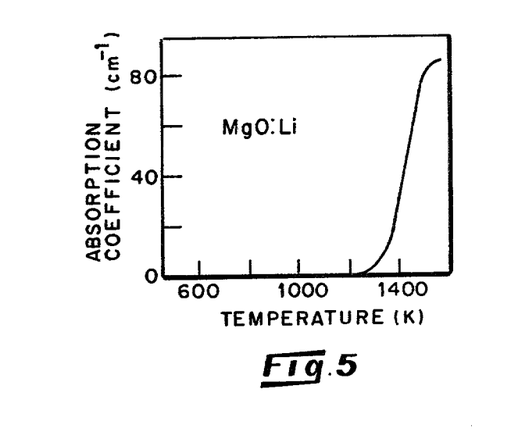
FIG. 5 correlates quenching temperature and absorption coefficient for a Li-doped MgO crystal which had been subjected to successive heating/quenching cycles, the crystal being heated in static air and quenched in liquid nitrogen.

In another series of experiments of similar Li-doped MgO crystal was subjected to a sucession of heating/quenching cycles. Heating was accomplished in the above-mentioned furnace, the atmosphere being static air and the furnacing time being ten minutes. After each furnacing operation the crystal was promptly quenched in liquid nitrogen. FIG. 5 correlates the furnacing temperature for each cycle with the corresponding absorption coefficient of the 1.83 eV band, which in turn is dependent on the total number of [Li]° defects formed. The number of these defects peaked at about 1600 K. and declined at higher temperatures, indicating that at 1600 K. all of the available lithium had been converted.

Figure 6:
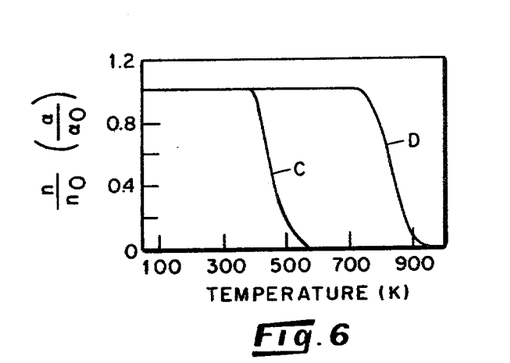
FIG. 6 is a graph comparing the annealing-out of [Li]° defects in a Li-doped MgO crystal which had been made semiconductive by exposure to high-dose electron irradiation and a similar crystal which had been made semiconductive by heating in static air and then quenching in liquid nitrogen.

FIG. 6 compares the annealing behavior of two Li-doped MgO crystals, both grown as described above. One of the crystals (Curve C) had been electron-radiated to a dose of $5 \times 10^{18}$ e/cm². (The optical absorption of the resulting 1.83-eV band was used to determine the normalized ratio $\alpha/\alpha_o$.) Following irradiation, this crystal was heated to various annealing temperatures in air and then quenched in liquid nitrogen to reduce the ratio $\alpha/\alpha_o$ to virtually zero. The other crystal (Curve D) had been furnaced for ten minutes at 1420 K. in static air to form [Li]° defects and then quenched in liquid nitrogen. The quenched crystal had an initial absorption coefficient of 40 cm$^{-1}$ at 1.83 eV. This crystal was annealed by heating to various temperatures above 300 K. in static air in the above-mentioned furnace, after which the crystal-containing quartz tube was removed from the furnace and permitted to cool slowly in room-temperature air. The resulting monotonic decrease in the normalized ratio $n/n_o(\alpha/\alpha_o)$ is shown in FIG. 6. As shown in that figure, half of the [Li]° defects in the irradiated sample were annealed out at approximately 450 K., as compared with approximately 830 K. for the thermally treated crystal. Thus, the latter crystal was characterized by [Li]° defects having a significantly higher stability with respect to temperature.

EXAMPLE 2

Crystal Heated in Flowing Oxygen before Quenching

Figure 4:
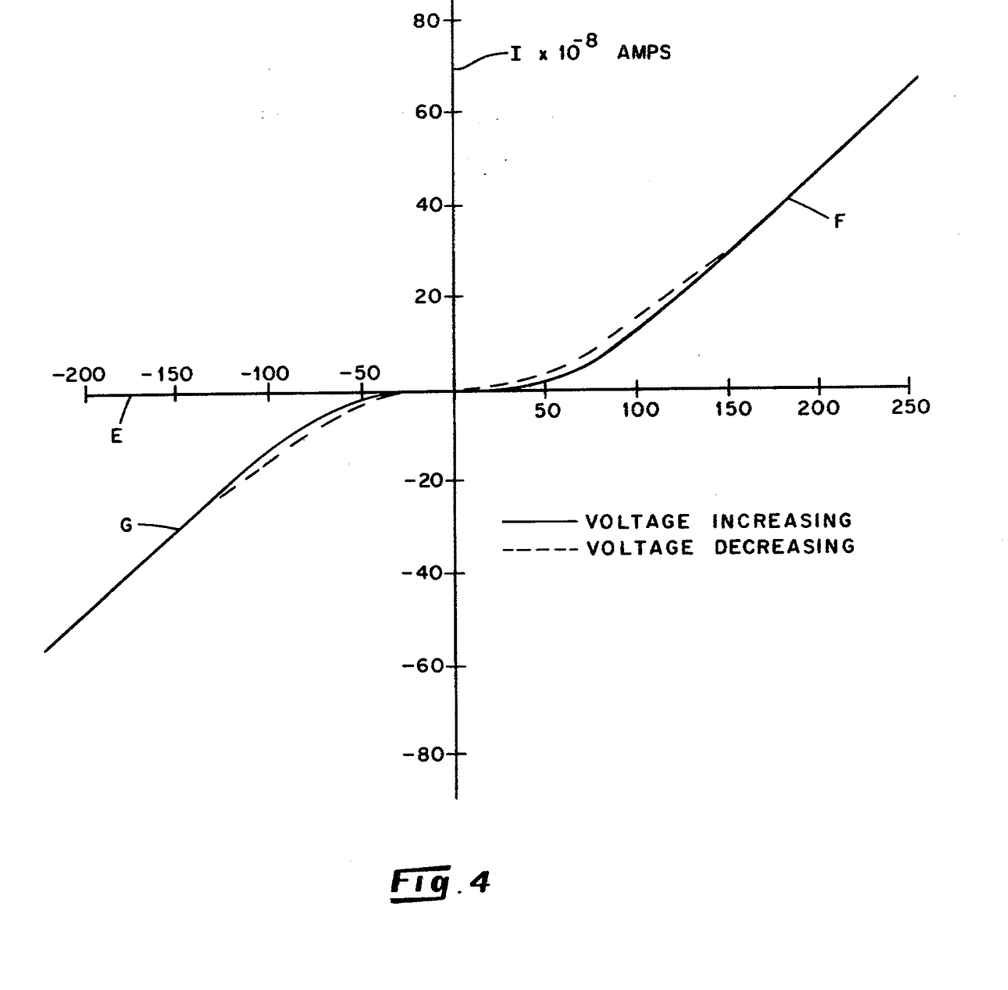
FIG. 4 is a conductivity curve for the crystal whose spectra are shown in FIGS. 1 and 2.
Figure 7:
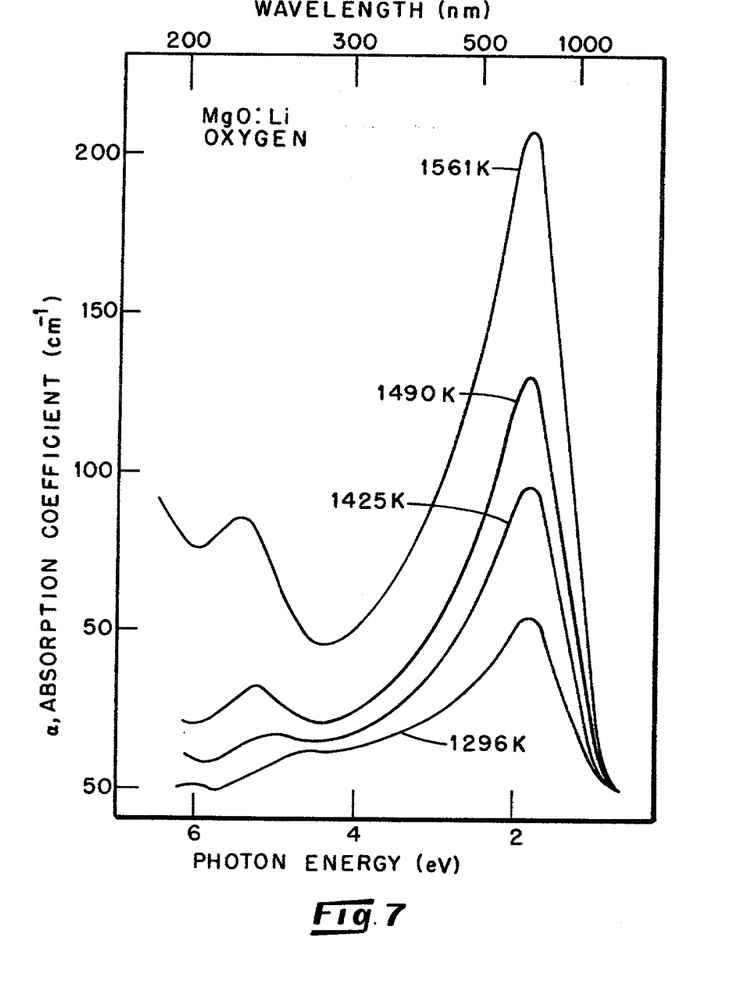
FIG. 7 is a graph presenting differential optical absorption spectra for a Li-doped MgO crystal which has been heated in flowing oxygen and then quenched in room-temperature air.
Figure 8:
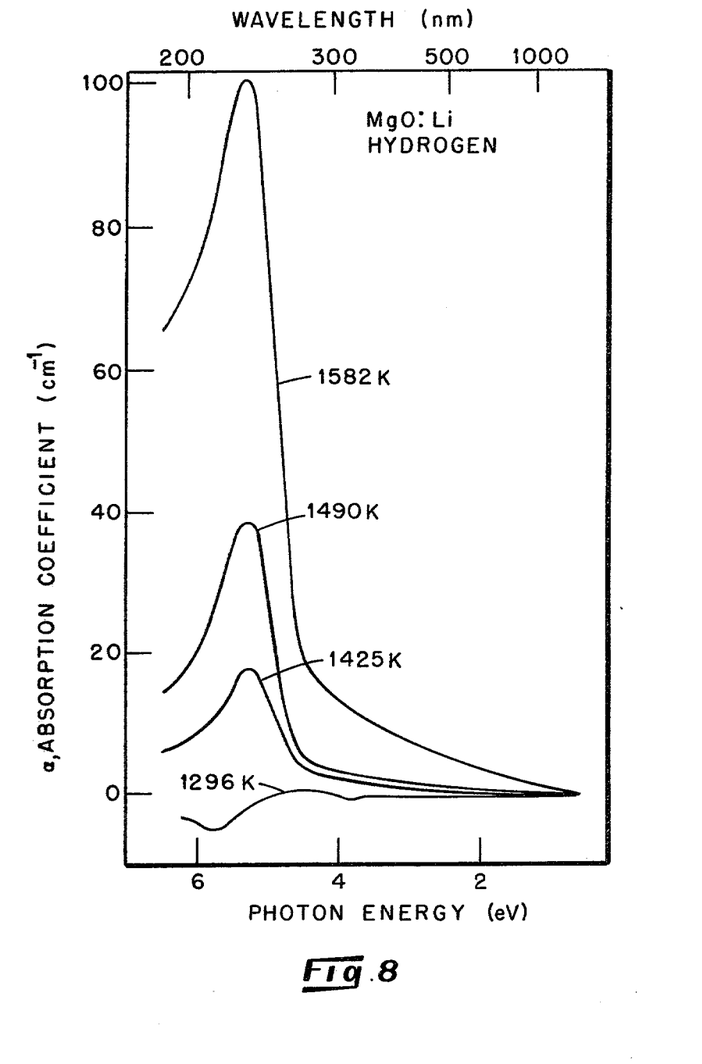
FIG. 8 presents differential optical absorption spectra for a Li-doped MgO crystal which had been heated in flowing gaseous hydrogen and then quenched in room-temperture hydrogen.

This experiment was conducted with a Li-doped MgO crystal derived from the same ingot as the sample referred to in Example 1. Stable [Li]° defects were formed in this crystal by means of a series of heating-and-quenching cycles similar to those in Example 1, with the exception that essentially pure oxygen was blown through the aforementioned quartz tube throughout each furnacing operation. (Typical flow rate: 20 $cm^3$ per min.) Quenching was effected by permitting the crystal to cool in the oxygen atmosphere, in a room-temperature portion of the tube. As in Example 1, furnacing in an oxygen-containing atmosphere caused the crystal to turn blue. FIG. 7 presents the differential optical absorption spectra for the quenched crystal. As shown, the primary absorption bands were at 5.3 and 1.8 eV, but the absorption coefficients for the 1.8 eV bands were much higher than those obtained in the above-mentioned runs conducted in static air, indicating the formation of a larger number of stable [Li]° defects and a higher level of conductivity. Referring to Curve B in FIG. 3, the threshold temperature (approximately 1100 K.) for the formation of [Li]° defects was considerably lower than in Example 1. The conductivity for the quenched crystal was measured by the above-referenced ASTM technique. The resulting current-versus-voltage curve is shown in FIG. 4; the conductivity values were even higher than for the crystal heated in static air and referred to in FIG. 3. After quenching at 1500 K., the crystal heated in flowing oxygen had an electrical resistance of about $5 \times 10^8$ ohms at 250 volts. These results were confirmed by other experiments in which similar crystals were furnaced for ten minutes in flowing oxygen and promptly quenched in oxygen at room temperature. Occassional examination of these and other crystals prepared as described showed the [Li]° defects to be stable indefinitely.

The conductivity of control single crystals of undoped MgO and as-grown Li-doped MgO produced as described above was measured by the above-referenced technique and found to be at least $10^4$ times lower than that of crystals containing [Li]° defects formed by our technique—i.e., heating in an oxygen-containing atmosphere and then quenching. Extrapolation of high-temperature conductivity in undoped MgO suggests that the room-temperature conductivity is below $10^{-20}$ ($\Omega$-cm)$^{-1}$. In order to check the possible conductivity contributions of thermally generated defects other than [Li]°, a Li-doped MgO single crystal was heated in oxygen-free nitrogen gas at 1450 K. for ten minutes and fast-cooled. This crystal exhibited a band at 5.3 eV, but no [Li]° defects, as evidenced by the absence of a band at 1.8 eV and the absence of the above-described change in coloration. The electrical conductivity of this specimen also was at least $10^4$ times smaller than the conductivities of our specimens thermally treated in oxygen. Hence, we conclude that the enhanced conductivity of our specimens is due to the generation of many stable [Li]° defects. This enhanced conductivity indicates either p- or n-type carriers. Our electron paramagnetic resonance studies and optical studies indicate that it is the hole at the lithium site which contributes to the conductivity. Thus, we believe that our semiconducting crystals are of the p type.

EXAMPLE 3

Crystal Heated in a Reducing Atmosphere before Quenching

A Li-doped MgO crystal grown as described was maintained at 1296 K. in a flowing hydrogen atmosphere for ten minutes and then quenched promptly by fast cooling in the room-temperature portion of the tube. This procedure was repeated at furnace temperatures of approximately 1390 K., 1425 K., and 1582 K. As indicated in FIG. 3, the differential optical-absorption spectra for the quenched crystal were characterized by a complete absence of the 1.8 eV band. The crystal appeared to be clear to the eye. This is in marked contrast to foregoing Examples 1–2. To prove that the absence of this band was due to the lack of oxygen and not to the presence of hydrogen, similar Li-doped MgO crystals were furnaced in other reducing or inert atmospheres and then quenched as described. No [Li]° defects were generated in crystals which were furnaced respectively in CO at 1600 K.; oxygen-free $N_2$ at 1600 K.; argon at 1500 K.; and high-pressure Mg vapor at 1900 K. in an enclosed bomb.

EXAMPLE 4

Li-doped CaO Crystal Heated in Oxygen before Quenching

Using the above-referenced arc-fusion technique, a highly pure, transparent single crystal of Li-doped CaO was produced. The crystal was heated in flowing oxygen for a period of 2 minutes at 1850 K and then promptly quenched in room-temperature air. The resulting crystal displayed the above-mentioned color change indicative of the formation of [Li]° centers, and electron paramagnetic resonance studies confirmed the presence of stable [Li]° centers.

In the foregoing examples the alkali-metal dopant was introduced during growth of the alkaline-earth-oxide crystal. If desired, however, the dopant may be dispersed in the grown crystal by any suitable doping technique, as by conventional high-temperature diffusion. The doped crystal then is furnaced and quenched as described above. The furnacing atmosphere may be undiluted oxygen or oxygen diluted with non-reactive gas. We prefer to conduct the furnacing operation in flowing oxygen, chiefly because this permits the use of somewhat lower furnace temperatures, presumably because more oxygen is available for reaction at the surfaces of the crystal. The gas flow rate is not critical. Given a suitable furnacing temperature, some [alkali]° defects will be formed in the presence of even trace amounts of oxygen. The furnacing time is not highly critical; a ten-minute period was employed in the foregoing examples to ensure that the crystal would come to furnace temperature before removal for quenching. However, [Li]° defects would be formed during longer or shorter periods. Within limits, the conductivity of the quenched crystal may be predetermined by selection of the furnacing temperature. We prefer to quench the hot crystal in gas rather than liquid, since the latter sometimes causes severe cracking. For convenience, we prefer to use gas for quenching, but this is not essential. Preferably, the crystal is quenched immediately after furnacing; exposure to a non-oxygen containing gas before quenching will cause some reduction in the number of stable [alkali]° defects. While quenching can be accomplished conveniently at room temperature, good results can be obtained at higher or lower temperatures. One skilled in the art can determine the suitability of other temperatures by merely routine experimentation.

A distinctive feature of our semiconducting crystals is that the amount of alkali-metal dopant dissolved in the crystal matrix is above the room-temperature saturation value. That is, the matrix is supersaturated with respect to the dopant. A doped crystal to be furnaced in accordance with our method typically contains dopant-containing precipitates as well as dopant in solution. When the crystal is heated to furnace temperature, much more of the dopant goes into solution, and the size of the precipitates is reduced appreciably. Quenching the hot crystal in effect "freezes" it in the high-temperature condition, meaning that the amount of dopant (e.g., lithium) in solution remains higher than it would otherwise be at room temperature and that the precipitates (e.g., $Li_2O$) remain smaller than they would otherwise be at room temperature. Electron micrographs confirm that the dopant-containing precipitates are smaller in the quenched crystals than in otherwise similar unquenched crystals.

Our method for producing our novel semiconductor is believed applicable to monocrystalline or polycrystalline MgO or CaO doped with either lithium or sodium. However, we consider lithium to be the most suitable alkali-metal dopant for the MgO crystals because its ionic size closely approaches that for magnesium. In the case of Li-doped CaO, the curve correlating the furnacing temperature (K.) and the absorption coefficient $\alpha$ can be expected to be displaced upward from 150 to 250 degrees relative to the same kind of curve for Li-doped MgO furnaced and quenched under the same conditions. Considering both types of crystal, the preferred furnacing temperature range is from about 1100 to 1850 K. Because it is slightly hygroscopic, the CaO semiconductor requires a protective coating of oil or the like. Our method also may be applicable to producing semiconducting SrO or BaO crystals doped with an alkali metal, but this has not been established.

Our crystals may be used in combination with various conventional components to provide novel semiconductor devices. For instances, a semiconducting crystal produced as described above may be incorporated in a novel semiconductor device comprising the crystal and an ohmic or non-ohmic contact formed on a surface thereof. Again, the crystal may be provided with spaced ohmic contacts to function as a voltage-dependent switch which remains open until the voltage applied thereacross attains a value initiating conduction. As another example, our semiconducting crystals may be used in otherwise conventional junction devices—such as p-n junction diode. In that application, the diode comprises two adjoining layers having opposite types of conductivity and forming a semiconductor junction therebetween, one of the layers being our p-type semiconductor material and the other being any suitable n-type material, each layer being provided with a suitable electrode, or contact. The two layers may be formed separately and then joined, or a near-surface portion of our crystal may be doped to form the desired p-n junction. The techniques for fabricating such devices are well known in the art, and would require only routine experimentation. These examples are illustrative only, and various other applications of our semiconductors will be apparent to those versed in the art. Because our method for producing semiconducting crystals is much simpler than conventional techniques, the semiconductor devices utilizing the same may be produced at a much lower overall cost.

What is claimed is:

1. A semiconductor device comprising adjoining layers having opposite types of conductivity and forming a semiconductor junction therebetween, one of said layers being characterized by n-type conductivity and the other being an alkali-metal-doped alkaline-earth-oxide crystal characterized by p-type conductivity, said crystal having been rendered semiconductive by heating in an oxygen-containing atmosphere to form [alkali]° defects therein and then promptly quenched to render said defects stable at room temperature, and electrodes respectively in contact with said layers.

2. The device of claim 1 wherein said alkaline-earth oxide is selected from the group consisting of MgO and CaO.

3. The device of claim 1 wherein said crystal is heated to a temperature in the range of from about 1100 K. to 1850 K. in said atmosphere.

4. The device of claim 1 wherein said atmosphere is selected from the group consisting of undiluted oxygen diluted with non-reactive gas.

5. The device of claim 1 wherein said atmosphere is a flowing atmosphere.

6. The device of claim 1 wherein said crystal is quenched by contact with a fluid.

7. A method of producing a voltage-dependent switching action, comprising:
providing a crystalline body of an alkali-metal-doped alkaline-earth-oxide which has been heated in an oxygen-containing atmosphere to form [alkali]° defects therein and then promptly quenching to render said defects stable at room temperature,
providing spaced electrodes on said body,
connecting said body into an electrical circuit via said spaced electrodes,
and causing said body to reversibly switch from a non-conductive state to a conductive state by applying a sufficient voltage across said spaced electrodes.

8. The method of claim 7 wherein said body is heated to a temperature in the range of from 1100 K. to 1850 K. in said atmosphere.

9. The method of claim 7 wherein said body is quenched in an oxygen-containing atmosphere.

10. The method of claim 7 wherein the atmosphere in which said body is quenched is at room temperature.

* * * * *

UNITED STATES PATENT OFFICE
CERTIFICATE OF CORRECTION

Patent No. 4,264,914　　　　　　　Dated April 28, 1981

Inventor(s) Marvin M. Abraham, Yok Chen, and Robert H. Kernohan

It is certified that error appears in the above-identified patent and that said Letters Patent are hereby corrected as shown below:

Column 8, lines 34 and 35, for "oxygen diluted" read ---oxygen and oxygen diluted---.

Signed and Sealed this

Fifteenth Day of June 1982

[SEAL]

Attest:

GERALD J. MOSSINGHOFF

Attesting Officer　　　　Commissioner of Patents and Trademarks